United States Patent
Broglia

(10) Patent No.: US 10,849,256 B2
(45) Date of Patent: Nov. 24, 2020

(54) COOLING DEVICE FOR A FREQUENCY CONVERTER, CONVERTER ASSEMBLY COMPRISING SAID COOLING DEVICE AND REFRIGERATING OR CONDITIONING PLANT COMPRISING SAID CONVERTER ASSEMBLY

(71) Applicant: FRASCOLD S.p.A., Rescaldina (IT)

(72) Inventor: Thomas Broglia, Rescaldina (IT)

(73) Assignee: FRASCOLD S.P.A. (IT)

( * ) Notice: Subject to any disclaimer, the term of this patent is extended or adjusted under 35 U.S.C. 154(b) by 946 days.

(21) Appl. No.: 14/895,066

(22) PCT Filed: Jun. 3, 2014

(86) PCT No.: PCT/IB2014/061921
§ 371 (c)(1),
(2) Date: Dec. 1, 2015

(87) PCT Pub. No.: WO2014/195870
PCT Pub. Date: Dec. 11, 2014

(65) Prior Publication Data
US 2016/0128241 A1 May 5, 2016

(30) Foreign Application Priority Data
Jun. 3, 2013 (IT) .............................. MI2013A0910

(51) Int. Cl.
*H05K 7/20* (2006.01)
*F25B 31/02* (2006.01)
*F25B 31/00* (2006.01)

(52) U.S. Cl.
CPC ....... *H05K 7/20936* (2013.01); *F25B 31/008* (2013.01); *F25B 31/02* (2013.01);
(Continued)

(58) Field of Classification Search
CPC .. H05K 7/20945; H05K 7/20936; H05K 7/20; H05K 7/20381; F24F 11/00; F25B 2700/21154
See application file for complete search history.

(56) References Cited

U.S. PATENT DOCUMENTS

| | | | |
|---|---|---|---|
| 4,720,981 A | 1/1988 | Helt et al. | |
| 5,603,227 A * | 2/1997 | Holden | F25B 5/02 62/193 |

(Continued)

FOREIGN PATENT DOCUMENTS

| | | |
|---|---|---|
| CN | 202470336 | 10/2012 |
| EP | 0933603 | 8/1999 |

(Continued)

OTHER PUBLICATIONS

Corresponding EPO Office Action for Application No. 14741372.8 dated Jan. 3, 2018.

(Continued)

*Primary Examiner* — Jianying C Atkisson
*Assistant Examiner* — Meraj A Shaikh
(74) *Attorney, Agent, or Firm* — The Belles Group, P.C.

(57) ABSTRACT

A cooling device for a frequency converter of a refrigerating or conditioning plant comprises at least one thermal exchange element supplied with a total flow rate of refrigerating fluid; regulating means configured to selectively regulate the total flow rate of refrigerating fluid on the basis of at least one parameter indicative of the temperature of the frequency converter.

14 Claims, 3 Drawing Sheets

(52) U.S. Cl.
CPC .. *H05K 7/20945* (2013.01); *F25B 2400/0409* (2013.01); *F25B 2400/0411* (2013.01); *F25B 2700/21154* (2013.01)

(56) References Cited

U.S. PATENT DOCUMENTS

| | | | | |
|---|---|---|---|---|
| 6,523,361 | B2* | 2/2003 | Higashiyama | B60H 1/3222 62/183 |
| 6,604,372 | B2* | 8/2003 | Baumert | B60H 1/3205 62/199 |
| 2001/0017039 | A1* | 8/2001 | Weimer | B60H 1/323 62/259.2 |
| 2002/0108384 | A1* | 8/2002 | Higashiyama | B60H 1/3222 62/228.4 |
| 2006/0113661 | A1 | 6/2006 | Yamabuchi et al. | |
| 2006/0180300 | A1 | 8/2006 | Lenehan et al. | |
| 2009/0092501 | A1* | 4/2009 | Seibel | F04B 35/04 417/44.1 |
| 2014/0305153 | A1* | 10/2014 | Arai | H05K 7/20936 62/190 |

FOREIGN PATENT DOCUMENTS

| | | | | |
|---|---|---|---|---|
| EP | 2568790 | | 3/2013 | |
| WO | 2011017385 | | 1/2011 | |
| WO | WO 2011017385 | A1 * | 2/2011 | ......... H05K 7/20381 |
| WO | 2011117829 | | 9/2011 | |

OTHER PUBLICATIONS

Corresponding International Search Report and Written Opinion for PCT/IB2014/061921 dated Sep. 9, 2014.

\* cited by examiner

COOLING DEVICE FOR A FREQUENCY CONVERTER, CONVERTER ASSEMBLY COMPRISING SAID COOLING DEVICE AND REFRIGERATING OR CONDITIONING PLANT COMPRISING SAID CONVERTER ASSEMBLY

CROSS-REFERENCE TO RELATED PATENT APPLICATIONS

The present application is a U.S. national stage application under 35 U.S.C. § 371 of PCT Application No. PCT/IB2014/061921, filed Jun. 3, 2014, which claims priority to Italian patent application MI2013A000910, filed Jun. 3, 2013, the entireties of which are incorporated herein by reference.

TECHNICAL FIELD

The present invention relates to a cooling device for a frequency converter, to a converter assembly comprising said cooling device and to a refrigerating or conditioning plant comprising said converter assembly.

BACKGROUND ART

Frequency converters, better known as "inverters", are used to regulate capacity or flow rate of the compressor in refrigerating plants used in the refrigeration and air conditioning industry.

The frequency converter is indeed connected to the compressor so as to regulate the supply of the electric motor of the compressor and to modify compressor speed.

The possibility of varying compressor speed is of fundamental importance because it allows consumption to be reduced when the plant requires a smaller refrigerating capacity than the maximum one. Indeed, maximum power in refrigerating or conditioning plants is only required for short periods.

In addition to energy savings, the possibility of regulating compressor speed also optimizes temperature control, thus eliminating thermal shocks.

Frequency converters normally used in refrigerating plants require a cooling device, usually an air cooling device, configured to cool the electronic components of the converter.

Nevertheless, components of a frequency converter are subject to variable heating mode and time.

Cooling devices of known type are configured to uniformly and constantly cool the components of the converter. Such a solution involves the occurrence of over-cooling or of under-cooling situations, depending on the operating conditions of the converter.

This inevitably involves the creation of condensate in the converter, with apparent risks in terms of converter reliability, or the occurrence of high temperatures which cause the system to stop safely.

A known solution, described in document WO 2011/117829, provides associating the heat exchanger with a fan configured to uniformly distribute the temperature in the shell containing both the heat exchanger and the frequency converter. Nevertheless, such a solution provides bleeding a constant quantity of refrigerating fluid, at the compressor inlet of the refrigerating or conditioning plant, even when the cooling needs of the frequency converter are reduced. This involves a reduction of the flow rate of refrigerating fluid available for the plant and therefore an overall reduction of the refrigerating efficiency of the plant.

A further solution provides using sponges capable of absorbing the excess moisture in the converter. However, such a solution does not sufficiently ensure the integrity and reliability of the components of the frequency converter.

DISCLOSURE OF INVENTION

It is thus one object of the present invention to make a cooling device for a frequency converter of refrigerating or conditioning plant which does not have the drawbacks of known art herein noted; in particular, it is one object of the invention to make a cooling device capable of avoiding the formation of condensate in the frequency converter and which, at the same time, optimizes the efficiency of the refrigerating plant.

In accordance with such objects, the present invention relates to a cooling device for a frequency converter of a refrigerating or conditioning plant according to claim 1.

It is a further object of the invention to provide a converter assembly for a refrigerating or conditioning plant capable of avoiding the formation of condensate in the frequency converter and of optimizing the efficiency of the refrigerating plant.

In accordance with such objects, the present invention relates to a converter assembly for a refrigerating or conditioning plant.

It is finally one object of the present invention to make a refrigerating or conditioning plant with optimized cooling efficiency with respect to the one of plants of the known art.

In accordance with such objects, the present invention relates to a refrigerating or conditioning plant.

BRIEF DESCRIPTION OF DRAWINGS

Further features and advantages of the present invention will become more apparent from the following description of a non-limiting embodiment thereof, with reference to the figures of the accompanying drawings, in which.

BEST MODE FOR CARRYING OUT THE INVENTION

Figure 1:
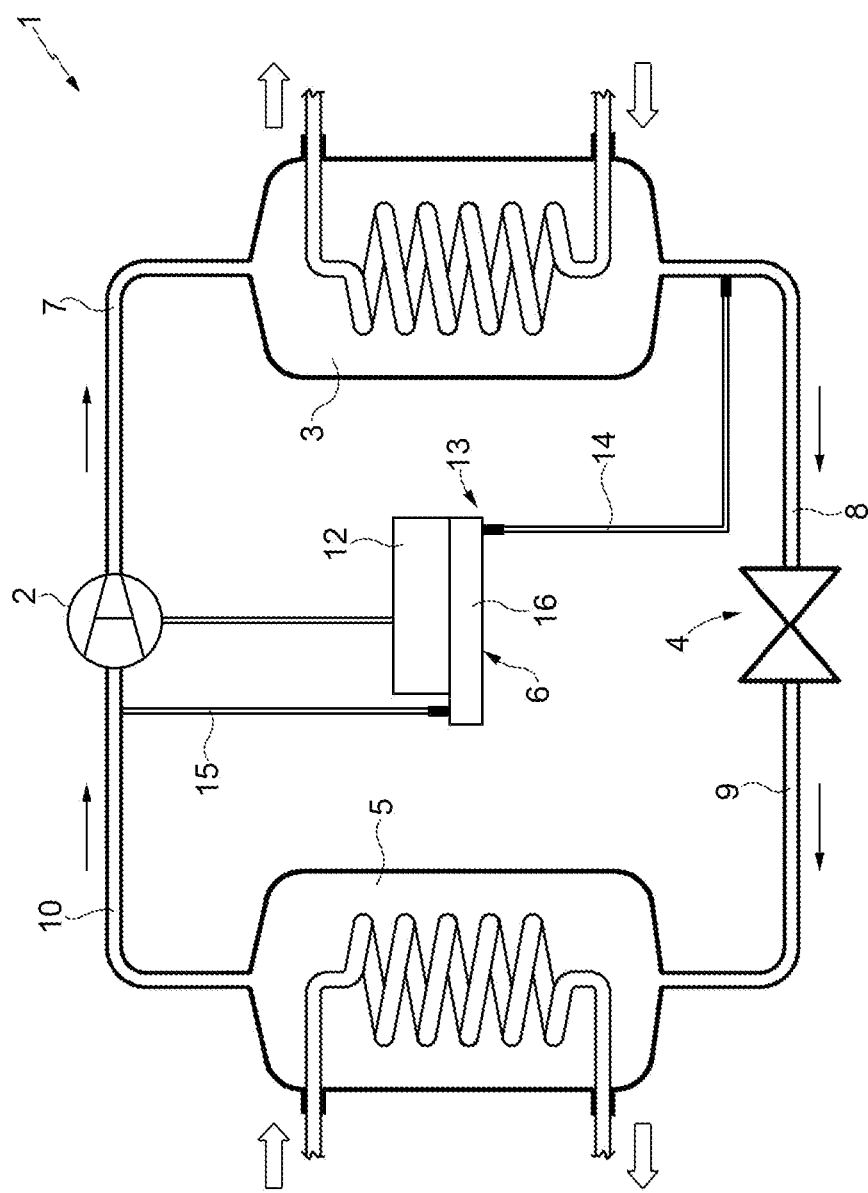
FIG. 1 is a diagrammatic depiction of a refrigerating or conditioning plant according to the present invention.

Numeral 1 in FIG. 1 indicates a refrigerating plant in which a refrigerating fluid circulates.

Refrigerating fluid is intended as a refrigerating substance which may take on the liquid or gaseous state in plant 1 according to the pressure and temperature conditions to which it is subjected.

The refrigerating fluid may be selected in the group comprising HCFC, HFC, HC, CO2 and HFO.

Plant 1 comprises a compressor 2, a condenser 3, an expansion valve 4, an evaporator 5 and a converter assembly 6.

Compressor 2 is configured to compress the refrigerating fluid and supply it to condenser 3 by means of a high pressure delivery line 7. In particular, the refrigerating fluid that is supplied to condenser 3 is in the form of vapour.

The refrigerating fluid in the form of vapour in condenser 3 is transformed into liquid form.

A high pressure line 8 supplies the refrigerating fluid output from condenser 3 to the expansion valve 4, where the pressure of the liquid refrigerating fluid is lowered in order to lower the evaporation temperature.

A low pressure line 9 supplies the refrigerating fluid output from the expansion valve 4 to evaporator 5, where heat is removed so that the refrigerating fluid evaporates at a constant pressure.

A low pressure suction line 10 supplies the refrigerating fluid in the form of vapour and at low pressure, to compressor 2.

Compressor 2 is preferably a screw refrigerating compressor. It is understood that compressor 2 may be any other known type of compressor such as, for example, a piston compressor, a centrifugal compressor, etc.

Compressor 2 comprises an electric motor (not illustrated in the accompanying drawings for simplicity), the supply of which is regulated by the converter assembly 6.

The converter assembly 6 comprises a frequency converter 12, configured to regulate the supply of the electric motor of compressor 2 and to modify the speed of compressor 2, and a cooling device 13, configured to cool the frequency converter 12.

The frequency converter 12 and the cooling device 13 are shown diagrammatically in FIG. 1 and are preferably arranged in contact with each other to promote the conduction cooling of the frequency converter 12.

The cooling device 13 is supplied with a refrigerating fluid.

In the non-limiting embodiment described and illustrated herein, the cooling device 13 is supplied with the same refrigerating fluid that circulates in the refrigerating or conditioning plant 1. In particular, the cooling device 13 comprises a suction line 14 configured to draw the refrigerating fluid downstream of condenser 3, a draining line 15 configured to drain the refrigerating fluid upstream of compressor 2, and a thermal exchange element 16 connected to the suction line 14 and to the draining line 15.

Figure 2:
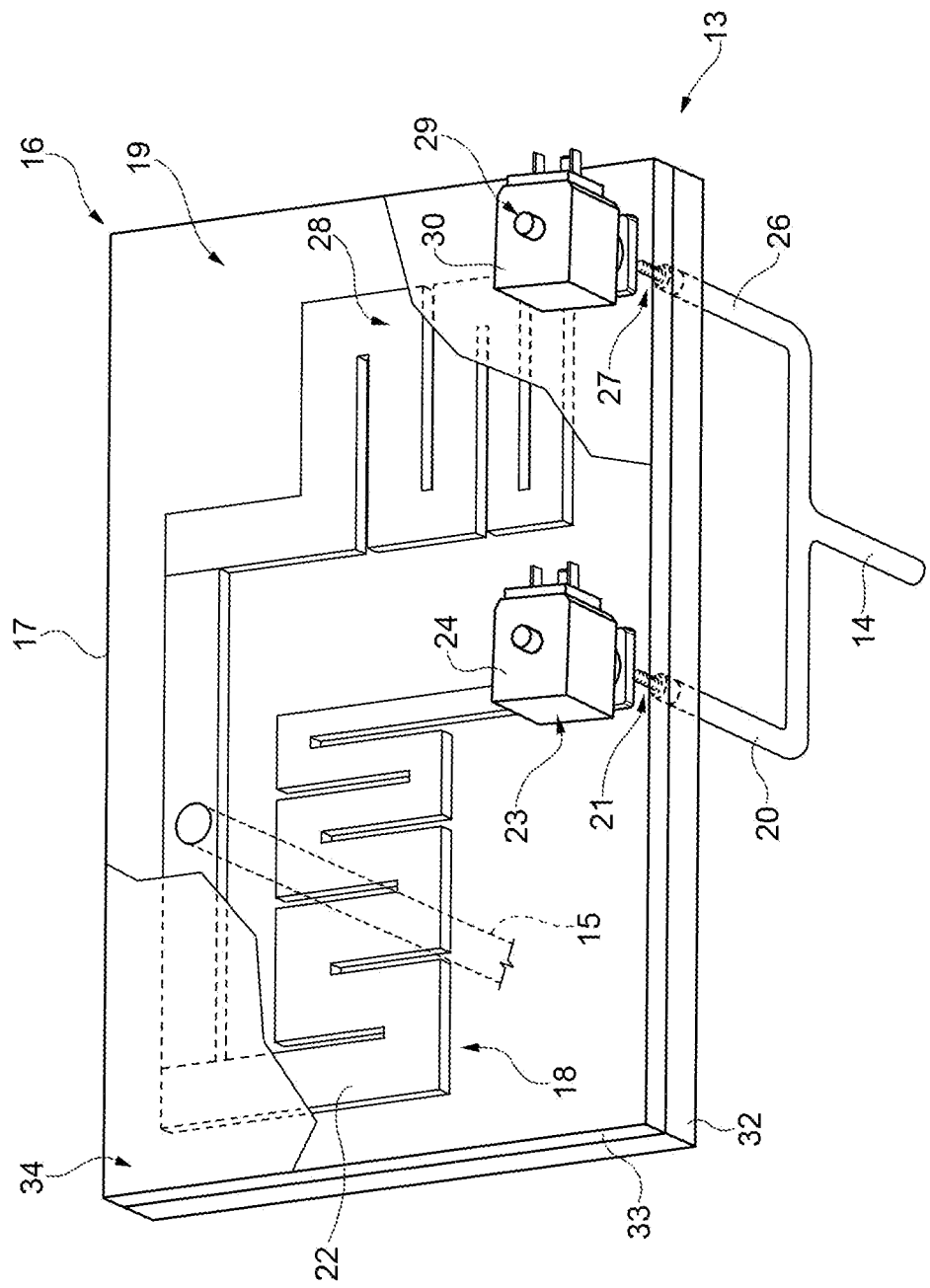
FIG. 2 is a perspective view, with sectional parts and parts removed for clarity, of a detail of the cooling device according to the present invention.

With reference to FIG. 2, the cooling device 13 also comprises a radiator 17, which at least partly houses the thermal exchange element 16.

The thermal exchange element 16 comprises at least a first portion 18 supplied, in use, with a first flow rate Q1 of refrigerating fluid and at least a second portion 19, which is also supplied, in use, with a second flow rate Q2 of refrigerating fluid.

The first portion 18 is configured to cool a respective first region 40 (FIG. 3) of the frequency converter 12, while the second portion is configured to cool a respective second region 41 (FIG. 3) of the frequency converter 12.

Preferably, the first portion 18 and the second portion 19 are coplanar and are side by side to conduction cool the first region 40 (FIG. 3) and the second region 41 (FIG. 3), respectively, of the frequency converter 12. Preferably, the first region 40 and the second region 41 (FIG. 3) are arranged side by side and comprise components with different thermal input to be disposed of, such as for example IGBTs and diodes.

In detail, the first portion 18 comprises a first inlet channel 20, a first expansion element 21, a first main channel 22 and a first regulating valve 23.

The first inlet channel 20 and the first main channel are connected to each other by the first expansion element 21. In the non-limiting embodiment described and illustrated herein, the first expansion element 21 is defined by a narrowing of cross-section between the first main channel 22 and the first inlet channel 20.

The first inlet channel 20 is connected to the suction line 14 and is supplied with the refrigerating fluid drawn downstream of condenser 3.

The narrowing defined, by the first expansion element 21 determines the expansion of the refrigerating fluid in the first main channel 22.

The first regulating valve 23 is configured to regulate the first flow rate Q1 of refrigerating fluid supplied to the main channel 22.

The first regulating valve 23 is preferably a solenoid valve provided with a main body 24 and with an occluding element (not shown in the accompanying drawings).

The main body 24 comprises a coil in which a channel is made. The occluding element is coupled to a ferrous nucleus arranged in a channel, and to a spring, arranged in the inner channel abutting against the ferrous nucleus. The occluding element is arranged so as to selectively occlude the narrowing of cross-section of the expansion element 21. One variant provides for the occluding element to be arranged so as to occlude the main channel 22.

In use, when the coil is not supplied with current, the spring keeps the occluding element in the position occluding the narrowing.

When the coil is supplied with current, the ferrous nucleus is attracted by the coil until overcoming the force of the spring and determining a sufficient movement of the occluding element to free the narrowing.

One variant (not illustrated) provides the regulating valve 23 to be configured to make a fine regulation of the flow rate of refrigerating fluid supplied to the first portion 18. For example, the regulating valve 23 may be a variable regulating valve.

Preferably, the first main channel 22 extends along a first serpentine path, which is preferably flat, and has a cross-section increasing along the flow direction of the refrigerating fluid.

Thereby, the expansion of the fluid is continuous along the first main channel 22. The heat removed from the refrigerating fluid causes the temperature of the refrigerating fluid to increase. However, such rising of temperature is compensated for by the continuous expansion of the fluid along the first main channel 22. Thereby, the temperature along the first main channel 22 is substantially kept constant.

Preferably, the first expansion element 21 and the first main channel 22 are wholly housed in radiator 17, while the first inlet channel 20 and the main body 24 of the regulating valve 23 are arranged outside of radiator 17.

The second portion 19 is substantially identical to the first portion 18 and comprises a second inlet channel 26, a second expansion element 27, a second main channel 28 and a second regulating valve 29.

The second inlet channel 26 and the second main channel 28 are connected to each other by the second expansion element 27. In the non-limiting embodiment herein described and illustrated, the second expansion element 27 is defined by a narrowing of cross-section between the second main channel 28 and the second inlet channel 26.

The second inlet channel 26 is connected to the suction line 14 and is supplied with the refrigerating fluid drawn downstream of condenser 3.

The narrowing defined by the second expansion element 27 determines the expansion of the refrigerating fluid in the second main channel 28.

The second regulating valve 29 is configured to regulate the second flow rate Q2 of refrigerating fluid supplied to the second main channel 28.

The second regulating valve 29 is preferably a solenoid valve provided with a main body 30 and with an occluding element (not shown in the accompanying drawings).

The main body 30 comprises a coil in which a channel is made. The occluding element is coupled to a ferrous nucleus arranged in a channel, and to a spring, arranged in the inner channel abutting against the ferrous nucleus. The occluding element is arranged so as to selectively occlude the narrowing of cross-section of the second expansion element 27. One variant provides for the occluding element to be arranged so as to occlude the main channel 28.

In use, when the coil is not supplied with current, the spring keeps the occluding element in the position occluding the narrowing of the second expansion element 27.

When the coil is supplied with current, the ferrous nucleus is attracted by the coil until overcoming the force of the spring and determining a sufficient movement of the occluding element to free the narrowing of the second expansion element 27.

One variant (not illustrated) provides the regulating valve 29 to be configured to make a fine regulation of the flow, rate of refrigerating fluid supplied to the second portion. For example, the regulating valve 29 may be a variable regulating valve.

Preferably, the second main channel 28 extends along a second serpentine path, which is preferably flat, and has a cross-section increasing along the flow direction of the refrigerating fluid.

Thereby, the expansion of the fluid is continuous along the second main channel 28. The heat removed from the refrigerating fluid causes the temperature of the refrigerating fluid to increase. However, such rising of temperature is compensated for by the continuous expansion of the fluid along the second main channel 28. Thereby, the temperature along the second main channel 28 is substantially kept constant.

Preferably, the second expansion element 27 and the second main channel 28 are wholly housed in radiator 17, while the second inlet channel 26 and the main body 30 of the second regulating valve 29 are arranged outside of radiator 17.

Preferably, radiator 17 is defined by two semi-shells 32, 33 coupled to each other.

The semi-shell 33 is configured to be coupled, in use, to the frequency converter 12. In particular, the semi-shell 33 is provided with a face 34 adapted to be coupled to the frequency converter 12.

One variant (not illustrated) provides the semi-shells 32 and 33 to be shaped so as to define suitable seats for housing the first main channel 22 and the second main channel 28.

A further variant provides the semi-shells 32 and 33 to be shaped so as to define, when coupled, the first main channel 22 and the second main channel 28.

In the non-limiting embodiment herein described and illustrated, the first regulating valve 23 and the second regulating valve 29 are solenoid valves, the supply of which is regulated by a device for controlling (not illustrated in the accompanying drawings for simplicity) the cooling device 13.

The control device is preferably configured to regulate the supply of the first regulating valve 23 and of the second regulating valve 29 on the basis of at least one signal indicative of the temperature of the frequency converter 12.

Figure 3:
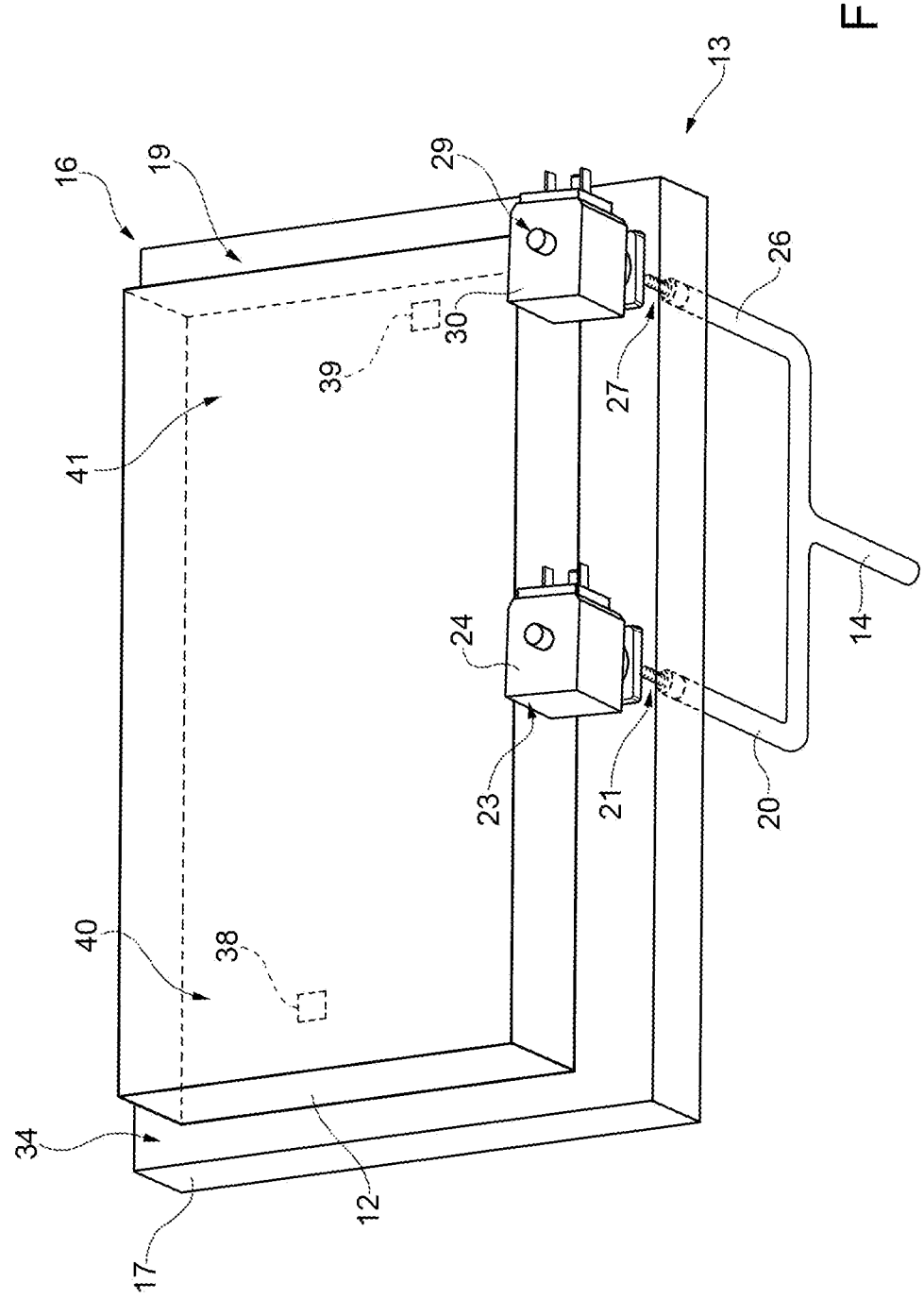
FIG. 3 is a perspective view, with parts removed for clarity, of a detail of the converter assembly according to the present invention.

With reference to FIG. 3, the frequency converter 12 is provided with a first temperature sensor 38 arranged along a first region of the frequency converter 12, which is arranged under the first portion 18 of the cooling device 13, and with at least a second temperature sensor 39 arranged along a second region of the frequency converter 12, which is arranged under the second portion 19 of the cooling device 13.

The control device is configured to control the opening of the first regulating valve 23 when the temperature detected by the first temperature sensor 38 exceeds a first threshold value, and to control the opening of the second regulating valve 29 when the temperature detected by the second temperature sensor 39 exceeds a second threshold value.

One variant (not illustrated) of the present invention provides more than two temperature sensors distributed in the frequency converter 12 and which supply the control device with the data acquired. Advantageously, the cooling device 12 according to the present invention is configured so as to minimize the quantity of refrigerating fluid used to cool the frequency converter 12.

Moreover, according to the present invention, the refrigerating fluid supplied to the cooling device 13 is drawn downstream of condenser 3 of the refrigerating or conditioning plant 1. Minimizing the flow rate of a refrigerating fluid therefore determines increasing the total efficiency of the refrigerating or conditioning plant 1 with apparent economic and energy advantages.

Due to the present invention, the quantity of refrigerating fluid drawn by the refrigerating or conditioning plant 1 is equal to approximately 1% of the average flow rate circulating in the refrigerating or conditioning plant 1. Moreover, such a quantity is drawn only when needed due to the presence of the regulating means.

Devices of the known art instead continuously draw a significant quantity of the average flow rate circulating in the refrigerating or conditioning plant 1, thus reducing the efficiency thereof.

Furthermore, the division of the thermal exchange element 16 into a first portion 18 and into a second portion 19, which are independently supplied, allows the cooling of the frequency converter 12 to be diversified according to needs.

This avoids the over-cooling of the components of the frequency converter 12 which typically overheat less, and the under-cooling of components which are typically very hot.

Due to the control of the refrigerating fluid flow rate in the cooling device 13, it is therefore possible to avoid the creation of condensate in the frequency converter 12 essentially due to excess cooling.

In conclusion, by accurately controlling the operating temperature of all electric components, not only is the efficiency increased of the frequency converter, but also the reliability thereof.

Finally, it is apparent that modifications and variants may be made to the cooling device, to the converter assembly and to the refrigerating or conditioning plant without departing from the scope of the appended claims.

The invention claimed is:

1. A refrigerating or conditioning plant in which a refrigerating fluid circulates, the refrigerating or conditioning plant comprising:
    a compressor comprising an electric motor;
    a condenser;
    an evaporator; and
    a converter assembly, the converter assembly comprising
        a frequency converter configured to regulate the speed of the electric motor and a cooling device for cooling the frequency converter, the cooling device comprising:
  a suction line configured to draw a flow rate of refrigerating fluid circulating in the plant downstream of the condenser;
  a draining line configured to drain the refrigerating fluid upstream of the compressor, the draining line exiting the cooling device and directly connected between the compressor and the evaporator;
  a thermal exchange element mounted to the frequency converter, the thermal exchange element connected to the suction line and to the draining line and supplied with the flow rate of the refrigerating fluid, the thermal exchange element comprising a first portion and a second portion, the first portion supplied with a first flow of the refrigerating fluid and configured to cool a respective first region of the frequency converter, the second portion supplied with a second flow of refrigerating fluid and configured to cool a respective second region of the frequency converter, the draining line coupled to the thermal exchange element at a single point to receive the first and second flows of refrigerating fluid; and
  regulating means configured to selectively regulate the first flow of refrigerating fluid and the second flow of refrigerating fluid, the regulating means further comprising a first regulating valve mounted to the thermal exchange element and configured to selectively regulate the first flow, a second regulating valve mounted to the thermal exchange element and configured to selectively regulate the second flow of the refrigerating fluid, and a controller configured to control the first regulating valve and the second regulating valve;
  wherein the frequency converter comprises a first sensor configured to detect at least a first parameter indicative of a temperature of the first region of the frequency converter and a second sensor configured to detect at least a second parameter indicative of a temperature of the second region of the frequency converter, the at least first and second parameters being supplied to the controller of the regulating means.

2. A refrigerating or conditioning plant according to claim 1, wherein the first portion and the second portion are substantially coplanar.

3. A refrigerating or conditioning plant according to claim 1, wherein the first portion and the second portion are substantially arranged side by side.

4. A refrigerating or conditioning plant according to claim 1, wherein the first portion comprises a first main channel, which extends along a first serpentine path.

5. A refrigerating or conditioning plant according to claim 4, wherein the second portion comprises a second main channel, which extends along a second serpentine path.

6. A refrigerating or conditioning plant according to claim 5, wherein the first main channel and the second main channel are parallel connected.

7. A refrigerating or conditioning plant according to claim 6, wherein the first main channel and the second main channel are arranged in parallel between the suction line and the draining line.

8. A refrigerating or conditioning plant according to claim 7, wherein the first portion comprises a first expansion element arranged between the first main channel and the suction line.

9. A refrigerating or conditioning plant according to claim 8, wherein the first expansion element is defined by a narrowing of the first main channel.

10. A refrigerating or conditioning plant according to claim 7, wherein the second portion comprises a second expansion element arranged between the second main channel and the suction line.

11. A refrigerating or conditioning plant according to claim 10, wherein the second expansion element is defined by a narrowing of the second main channel.

12. A refrigerating or conditioning plant according to claim 4, wherein the first main channel has a cross-section increasing along the flow direction.

13. A refrigerating or conditioning plant according to claim 5, wherein the second main channel has a cross-section increasing along the flow direction.

14. A refrigerating or conditioning plant in which a refrigerating fluid circulates, the refrigerating or conditioning plant comprising:
  a compressor;
  a condenser; and
  a converter assembly, the converter assembly comprising
    a frequency converter which regulates the speed of the compressor and a cooling device for cooling the frequency converter, the cooling device comprising:
      a suction line drawing a flow of the refrigerating fluid downstream of the condenser;
      a draining line draining the flow of the refrigerating fluid upstream of the compressor;
      a thermal exchange element connected to the suction line and to the draining line and supplied with the flow of the refrigerating fluid, the thermal exchange element comprising a first portion and a second portion, the first portion supplied with a first flow of the refrigerating fluid and configured to cool a respective first region of the frequency converter, the second portion supplied with a second flow of refrigerating fluid and configured to cool a respective second region of the frequency converter, the draining line coupled to the thermal exchange at a single point to receive the first and second flows of refrigerating fluid; and
    regulating means comprising a first regulating valve and a second regulating valve, the first regulating valve configured to selectively regulate the first flow of refrigerating fluid on the basis of at least one first parameter indicative of the temperature of the first region of the frequency converter, the at least one first parameter provided by a first sensor mounted in the first region of the frequency converter, the second regulating valve configured to selectively regulate the second flow of refrigerating fluid on the basis of at least one second parameter indicative of the temperature of the second region of the frequency converter, the at least one second parameter provided by a second sensor mounted in the second region of the frequency converter.

* * * * *